United States Patent [19]

Herrmann

[11] Patent Number: 5,204,676
[45] Date of Patent: Apr. 20, 1993

[54] CIRCUIT ARRANGEMENT FOR FREQUENCY CONVERSION OF A DIGITAL SIGNAL

[75] Inventor: Matthias Herrmann, Braunschweig, Fed. Rep. of Germany

[73] Assignee: U.S. Philips Corporation, New York, N.Y.

[21] Appl. No.: 808,336

[22] Filed: Dec. 16, 1991

[30] Foreign Application Priority Data

Dec. 17, 1990 [DE] Fed. Rep. of Germany ....... 4040299

[51] Int. Cl.⁵ .................. H03M 7/00; H04N 7/13; H04J 3/22
[52] U.S. Cl. .................................. 341/61; 358/140; 370/84
[58] Field of Search ............... 341/61, 63; 358/140, 358/158; 328/140; 377/47; 375/23, 111, 118; 370/84

[56] References Cited

U.S. PATENT DOCUMENTS

| | | | |
|---|---|---|---|
| 4,612,573 | 9/1986 | Grallert et al. ............... | 358/140 |
| 4,797,845 | 1/1989 | Stikvoort ....................... | 341/123 X |
| 4,989,221 | 1/1991 | Qureshi et al. ............... | 375/118 X |
| 4,996,528 | 2/1991 | Asghar et al. ................. | 341/61 X |
| 5,111,488 | 5/1992 | Chaisemartin et al. ....... | 377/47 X |

Primary Examiner—Sharon D. Logan
Attorney, Agent, or Firm—Edward W. Goodman

[57] ABSTRACT

A circuit arrangement for converting a digital signal of a first frequency into a signal of a second frequency and including an interpolator/decimator is characterized, notably for asynchronous first and second clock signals, in that there is provided at least one multiplexer arrangement which includes a first register which is clocked at the inverted first clock frequency and a second register which is clocked at the second clock frequency, and also includes a multiplexer, the input signal of the multiplexer arrangement being applied to the first register and to a first input of the multiplexer whose second input is coupled to the output of the first register, there also being provided a control circuit which alternately switches the signals applied to the two inputs of the multiplexer to its output in such a manner that at the instants at which this signal is written into the second register a valid signal is always present at the output of the multiplexer.

8 Claims, 2 Drawing Sheets

CIRCUIT ARRANGEMENT FOR FREQUENCY CONVERSION OF A DIGITAL SIGNAL

BACKGROUND OF THE INVENTION

1. Field of the Invention

The invention relates to a circuit arrangement for converting a digital data signal having a first clock frequency into a signal having a second clock frequency, comprising an interpolator/decimator which includes a series of successively connected input registers for the data signal, each register comprising a clock input for a register clock signal, a data input for the data signal, and a data output which is coupled to an input of arithmetic circuits for calculating a linear combination of output signals. Using the arithmetic circuits, the output signals of the registers can be multiplied by filter coefficients and added subsequently.

The invention also relates to an image display device or television apparatus comprising an input for a digital input signal, which image display apparatus comprises such a circuit arrangement for converting the digital input signal into a digital signal of a second clock frequency as well as means for generating images on a display screen on the basis of a digital signal of the second clock frequency.

2. Description of the Related Art

A circuit arrangement of this kind is known, for example from European Patent Application 0 336 669. Like many other such known arrangements, however, the described circuit arrangement operates on the basis of a given, fixed rational numerical ratio of the first and the second clock frequency. Thus, the range of application of these circuit arrangements is substantially limited in that the frequency ratio of the two clock signals must have a known, fixed value. The reason why this limitation is to be imposed on the known circuit arrangement is that all circuit arrangements of this kind necessarily operate with registers in which the data is buffered. Part of these registers must be clocked at the first frequency and another part is clocked at the second frequency. A problem is then encountered in that such registers can be realized only so that the data present at the input of a register for transfer in said register may not change during a given time interval. This is the time interval preceding and succeeding the clock pulse edge whereby the data is to be transferred into the register. Moreover, after the transfer of the data into the register, the data appears at the output only after a time delay and does not become valid until after said period of time has elapsed. These periods of time are customarily designated as "data set-up time" and "data hold time". Because of these periods during which the input data may not be modified or the output data is not yet valid, respectively, successively connected registers clocked at different clock frequencies give rise to the problem that when the edges of the clock signals overlap, the output data of the first register will change of -at a moment- when the input signals of the second register may not be modified. The data written into the second register is then undefined and represents a signal disturbance.

European Patent Application 0 227 172 discloses a coefficient generator comprising a closed phase control loop for a filter which operates with a non-rational ratio of the input and output frequencies. The cited Application essentially relates to the problem of generating the filter coefficients and only marinally deals with the arrangement for converting the clock frequency. Again a fixed ratio exists between the two clock signals; however, according to the teaching of this application they may also exhibit a non-rational ratio. For compensation of the two clock frequencies a buffer memory is connected to the output of the circuit arrangement.

SUMMARY OF THE INVENTION

It is an object of the invention to provide a circuit arrangement of the kind set forth which has a simple construction and which enables clock frequency conversion between two clock signals which do not have a fixed relationship, that is to say clock signals which are asynchronous and have edges which are shifted relative to one another and which may also overlap, i.e. occur simultaneously.

This object is achieved in accordance with the invention in that at least one multiplexer is provided between an input register and the arithmetic circuits, a first input of the multiplexer being coupled to a data output of an input register, a second input of the multiplexer being coupled, via a first register, to said data output and an output of the multiplexer being coupled to an input of second register, said first register comprising a clock input which is coupled to the output of an inverter in order to present the inverted register clock signal, said second register comprising a clock input for a clock signal of the second clock frequency, said circuit arrangement furthermore comprising a control circuit, an output of which is coupled to a control input of the multiplexer in order to apply a control signal thereto so that the multiplexer output is connected to that input of the multiplexer that receives a stable signal during the writing of data into the second register.

The described problem where the edges of the two possibly asynchronous clock pulses are freely shifted relative to one another and where a register operating at the second clock frequency is to take up a new value of the digital signal when the signal of the first sampling frequency changes, i.e. when the edges of the two clock pulses overlap and occur simultaneously or substantially simultaneously, is mitigated in the circuit arrangement in accordance with the invention in that there is provided at least one multiplexer arrangement. In principle this multiplexer arrangement can be inserted at any suitable position within the circuit arrangement. For example, when it is arranged within the polyphase structure in the interpolator/decimator, a multiplexer arrangement should be provided in each branch of the interpolator/decimator.

Each multiplexer arrangement comprises a multiplexer having two inputs. The first input receives the digital signal of the first clock frequency. Via the first register, being clocked by the inverted first clock signal, the same digital signal reaches the second input of the multiplexer, be it with a phase shifted of 180°. These two inputs can be connected at option, via a control circuit, to the output of the multiplexer whose output data is transferred to a second register which operates at the second clock frequency, i.e. the clock frequency whereto the digital signal is to be converted.

As mentioned above, the input data of the second register may not be modified in the time interval during which a clock pulse edge of the second clock signal occurs with which new data is transferred to the second register. Moreover, the input data at both inputs of the multiplexer change in the periods during which the output data of preceding registers change. The control circuit alternately connects the two inputs of the multiplexer to its output in such a manner that the output of the multiplexer carries fixed, valid, non-changing data during the intervals in which signals are to be written into the second register, i.e. the intervals during which the data present at the input of the second register may not change. To this end, switching over takes place between the digital signal of the first frequency and the same signal whose phase has been shifted 180°, so that during the time intervals in which new data is to be transferred to the second register, the output of the multiplexer invariably carries that one of the two signals applied to the multiplexer which definitely does not change during the respective time interval.

In the described arrangement the first and the second clock frequency need not be coupled in respect of frequency ratio, so that they be asynchronous and shift freely. The circuit arrangement for frequency conversion is thus suitable for a very broad range of application.

In an embodiment of the invention, each of the successively connected registers in the interpolator/decimator is succeeded by a respective multiplexer arrangement whose output signals are applied to the respective associated multiplier, the first clock frequency being used as the register clock signal and a common control circuit being provided for the multiplexer arrangements.

Interpolators/decimators have a structure in which a chain of registers is provided at the input side, each register being succeeded by a respective multiplier in which a filter coefficient is applied to the output data of the associated register. The data thus subjected to filter coefficients is subsequently added. The multiplexer arrangement can be advantageously provided in each of these branches of the interpolator/decimator. To this end, in each branch of the interpolator/decimator it should be connected between the preceding register of the successively connected registers and the multiplier provided in the branch. The successively connected registers are then clocked at the first clock frequency. A common control circuit can be provided for all multiplexer arrangements inserted in the various branches of the interpolator/decimator, because the multiplexers in the multiplexer arrangements can be switched in the same way in all branches. This is possible because of all registers preceding the multiplexer arrangements are clocked at the first clock frequency, so that their output signals change or are valid during the same time intervals.

In a further embodiment of the invention, the control circuit comprises a first and a second delay member which delay the first clock signal and the inverted first clock signal, respectively, by such an amount of time that the edges of the delayed first clock signal indicate the instants at which new data appearing at the first inputs of the multipliers is already valid and data present at the second inputs is still valid, and that the edges of the delayed inverted first clock signal indicate the instants at which new data appearing at the second inputs is already valid and data present at the first inputs is still valid.

In order to enable the control circuit to switch between the inputs of the multiplexers in the multiplexer arrangements in the described manner, the control circuit requires information as to when the output signals of the preceding registers are valid and do not change.

This information can be advantageously extracted within the control circuit in that the first clock signal and the inverted clock signal are delayed by respective amounts of time such that the edges of these delayed signals indicate the instants at which valid output signals appear at the outputs of the preceding registers clocked by the first clock signal or the inverted first clock signal. The first clock signal is delayed by such an amount that the edges of this delayed clock signal indicate the instants at which the new data appearing at the first inputs of the multiplexers is already valid and the data present at the second inputs is still valid. The data present at the first multiplexer inputs originates from the preceding register of the succession of registers whose output signals become valid only after a given so-called propagation delay time. On the other hand, the data present at the second inputs of the multiplexers and originating from the first register of the multiplexer arrangement must still be valid, i.e. new data may not yet be written into this register. The instants marked by the delayed first clock signal, therefore, must be situated between these two instants. The same is applicable, be it in the reverse manner, to the delayed inverted first clock signal, which must be set up so that its edges designate the instants at which the data present at the second inputs and originating from the first register is already valid and, moreover, the data present at the first register inputs and originating from the associated, preceding register of the succession of registers is still valid. The edges of these delayed clock signals thus indicate instants at which the relevant signal present at the first or the second input of the multiplexer is valid and the respective other signal is still valid.

In a further embodiment this information can be advantageously used in that the control circuit comprises a first phase comparator which performs a phase comparison between the clock signal supplied by the first delay member and the second clock signal, as well as a second phase comparator which performs a phase comparison between the signal supplied by the second delay member and the second clock signal, the output signals of the two phase comparators being applied to a first and a second pulse generator, the output signals of the two pulse generators being used for switching over the multiplexers in the multiplexer arrangements.

As mentioned, it must be prevented that data is transferred to the second register exactly when the output data of the multiplexer or the register preceding the multiplexer change. To this end, the two phase comparators supply a signal which represents the phase shift between the clock signal supplied by the first delay member or the delayed inverted first clock signal, and the second clock signal. This phase shift is indirectly indicative as to when the edges of the first and the second clock signal overlap and when the described situation to be avoided occurs. The output signals of the phase comparators, or the subsequent pulse generators, can thus be used for the switching between the multiplexer inputs in the desired manner.

In a further embodiment of the invention, this can be advantageously achieved in that the control circuit switches between the two multiplexer inputs of the multiplexers provided in the multiplexer arrangements in dependence on the output signals of the two pulse generators in such a manner that switching over to the first multiplexer inputs occurs when the first phase comparator supplies an output signal indicating that the corresponding edges of the delayed first clock signal and the second clock signal overlap, while switching over to the second multiplexer inputs takes place when the second phase comparator supplies an output signal indicating that the corresponding edges of the delayed inverted first clock signal and the second clock signal overlap.

When the output signal of the first phase comparator or the subsequent first pulse generator indicates that the phase shift between the edges of the delayed first clock signal and the second clock signal amounts to substantially zero, the data is valid which is present at the first input of the multiplexer at the instants at which the data is written into the second register by way of the second clock signal. Therefore, in this case the control circuit switches over to the first multiplexer inputs. Conversely, the second phase comparator, or the subsequent pulse generator, supplies an output signal indicating a phase which is substantially zero when the data present at the second inputs of the multiplexers is valid at the instants at which the second register is clocked by the second clock frequency. In this case, therefore, the control circuit can switch over to the second multiplexer inputs. This comparatively simple arrangement thus enables switching between the multiplexer inputs in the described manner.

The circuit arrangement can be laid out especially for a digital television signal which is to be converted from a first clock frequency to a second clock frequency. The digital signal may also originate, for example from a computer generating an image or from a magnetic tape or optical disc storing digitally encoded images. The circuit arrangement in accordance with the invention can then be included in an apparatus for reading out such a data carrier, in an apparatus for recording the images in digital form, or in a separate apparatus for the display of the images stored, for example a multi-standard television receiver or video recorder.

In this respect, in a further embodiment of the invention the circuit arrangement for converting a digital signal of a first clock frequency into a signal of a second clock frequency may notably be succeeded by an image signal processing circuit in which a digital image signal is processed with a system frequency which is not coupled to the image signal and which image processing circuit includes a correction memory and an interpolator with a decimator which serves to convert the digital image signal to a synchronized signal raster imposed by the system clock, the circuit arrangement for converting the digital signal being used to convert the image signal of system frequency supplied by the image signal processing circuit to a different frequency.

In the preceding image signal processing circuit, a television signal previously scanned at a free-running, fixed frequency and converted into digital form is written into the correction memory whose output signals traverse the interpolator/decimator which is provided in the image signal processing circuit and which operates at one frequency only. The correction memory and the interpolator/decimator included in the image signal processing circuit serve to transform the components, initially being asynchronous because of the free-running scanning and possibly instable in respect of their time base, in a defined raster. Thus, the output of the image signal processing circuit carries digital television signal data transformed in the raster. It may be desirable to convert this data again to a different scanning frequency, for which the circuit arrangement in accordance with the invention can be advantageously used.

BRIEF DESCRIPTION OF THE DRAWINGS

An embodiment of the invention will be described in detail hereinafter with reference to the drawings. Therein.

DESCRIPTION OF THE PREFERRED EMBODIMENT

Figure 1:
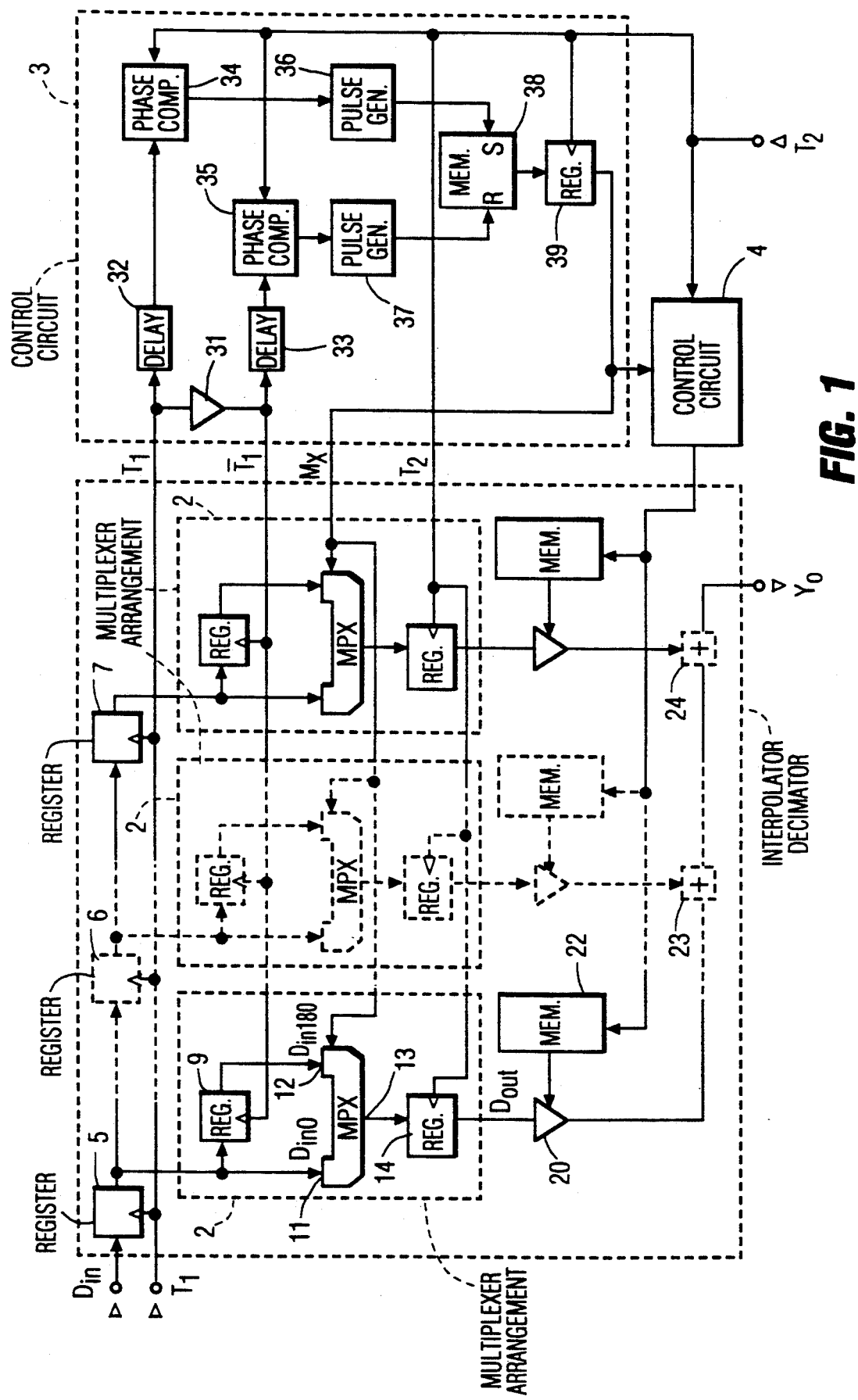
FIG. 1 shows a block diagram of an embodiment of the circuit arrangement for clock frequency conversion.

The block diagram of an embodiment of the circuit arrangement for clock frequency conversion of a digital signal as shown in FIG. 1 can be used, for example to convert a digital television signal, denoted by the reference $D_{in}$ in the Figure and having a first clock frequency $T_1$, into a second clock frequency $T_2$. To this end, the circuit arrangement comprises an interpolator/decimator 1 in which several multiplexer arrangements 2 are integrated. There is also provided a control circuit 3 which controls multiplexers 10 included in the multiplexer arrangements 2. The selection of the filter coefficients required in the interpolator/decimator is performed by an interpolator control circuit 4.

The interpolator/decimator 1 shown in FIG. 1 has a known polyphase structure. The exact operation of the interpolator/decimator will not be described in detail hereinafter; the same holds for the selection of the filter coefficients in the interpolator/decimator by the control circuit 4.

At the input side of the interpolator/decimator 1 there is provided a series of successively connected registers 5, 6 and 7. The number of such successively connected registers depends on the number of signals to be processed in parallel in the branches of the interpolator/decimator. The choice of the number of branches itself depends on the permissible residual ripple of the amplitude frequency response of the data emanating from the interpolator/decimator. The criteria for the choice of these parameters are known and will not be elaborated upon hereinafter. In FIG. 1 it has been assumed for the sake of simplicity that the interpolator/decimator comprises three parallel branches.

The successively connected registers 5, 6 and 7 are clocked at the first frequency $T_1$ which is the frequency of the digital television signal $D_{in}$. Thus, for example the register 6 delays the television signal appearing at the output of the register 5 by a further clock pulse in the scanning signal. The signal appearing at the output of the register 6 is delayed by a further scanning clock pulse by the register 7. Thus, data of the digital television signal which has been shifted one clock pulse in the scanning signal with respect to one another are present at the outputs of the registers 5, 6 and 7.

Each of the successively connected registers 5, 6 and 7 is succeeded by a respective multiplexer arrangement 2. The construction of the multiplexer arrangements 2 is identical, so that the following description, given by way of example, of the construction of the multiplexer arrangement succeeding the register 5 is readily applicable, together with its references, to the multiplexer arrangements succeeding the registers 6 and 7. Each of the multiplexer arrangements 2 comprises a multiplexer 10 whose first input receives the output signal of the respective preceding register of the series of successively connected registers.

The multiplexer 10 in the multiplexer arrangement 2 succeeding the register 5 comprises a first input 11 which is connected to the output of the register 5. The data appearing at the output of the register 5 is also written in a first register 9 which is also included in the multiplexer arrangement 2. The first register 9 is clocked at the inverted first clock frequency which is designated $\overline{T}_1$ in FIG. 1. The output signals of the register 9 are applied to a second input 12 of the multiplexer 10. Because of the clocking of the register 9 by the inverted first clock frequency, the data appearing at the second input 12 of the multiplexer 10 has been phase shifted 180° with respect to the data present at the first input 11.

The multiplexer 10 comprises an output 13 whose signals are written into a subsequent second register 14. The register 14 is clocked at the second clock frequency $T_2$ whereto the data is to be converted. The output signal $D_{out}$ of the second register 14 is applied to a multiplier 20 which receives filter coefficients from a coefficient memory 22, the digital television signal data $D_{out}$ being multiplied by said filter coefficients.

As has already been stated, a plurality of identically wired branches of the interpolator/decimator, comprising a respective multiplexer arrangement 2, a multiplier 20 and a coefficient memory 22, are identically constructed and connected in parallel. The output signals of the multipliers 20 of the various branches of the interpolator/decimator are added in adders 23 and 24 so that the filtered digital television signal, converted from the first frequency to the second frequency and designated by the reference $Y_o$ in FIG. 1, appears at the output of the last adder 24.

The filter coefficients stored in the various coefficient memories 22 are selected by the interpolator control circuit 4.

The multiplexers 10 in the multiplexer arrangements 2 are controlled by means of the control circuit 3. This control circuit 3 receives the first clock signal $T_1$ and the second clock signal $T_2$. The first clock signal $T_1$ is inverted in the control circuit 3 by means of an inverter 31, thus producing the inverted first clock signal $\overline{T}_1$. This clock signal is applied to all first registers 9 within the multiplexer arrangements 2.

The control circuit 3 also includes a first delay member 32 which delays the first clock signal $T_1$ by such an amount that the edges of the output signal of the first delay member 32 indicate the instants at which the values of the output signals of the registers 5, 6 and 7 are valid and at which the output data of the first register 9 is still valid. Similarly, there is provided a second delay member 33 which delays the inverted first clock signal $\overline{T}_1$ by such an amount that the edges of its output signal indicate the instants at which valid output signals are present at the outputs of the first registers 9 of the multiplexer arrangements 2 and at which the output data of the successively connected registers 5, 6 and 7 is still valid.

The control circuit 3 furthermore comprises a first phase comparator 34 which receives the output signal of the first delay member 32 as well as the second clock signal $T_2$. A second phase comparator 35 receives the output signal of the delay member 33, i.e. the clock signal $\overline{T}_{1\tau}$, as well as the second clock signal $T_2$. The first phase comparator 34 is succeeded by a first pulse generator 36 and the second phase comparator 35 is succeeded by a second pulse generator 37. The outputs of the pulse generators 36 and 37 are connected to the two inputs of a static RS memory 38. The output signal of the memory 38 is applied to a register 39 which is clocked by the clock signal $T_2$. The output signal of the register 39 represents a switching signal $M_x$ which is applied to all multiplexers 10 of the multiplexer arrangements 2 and which serves for switching between the two inputs of these multiplexers.

Figure 2:
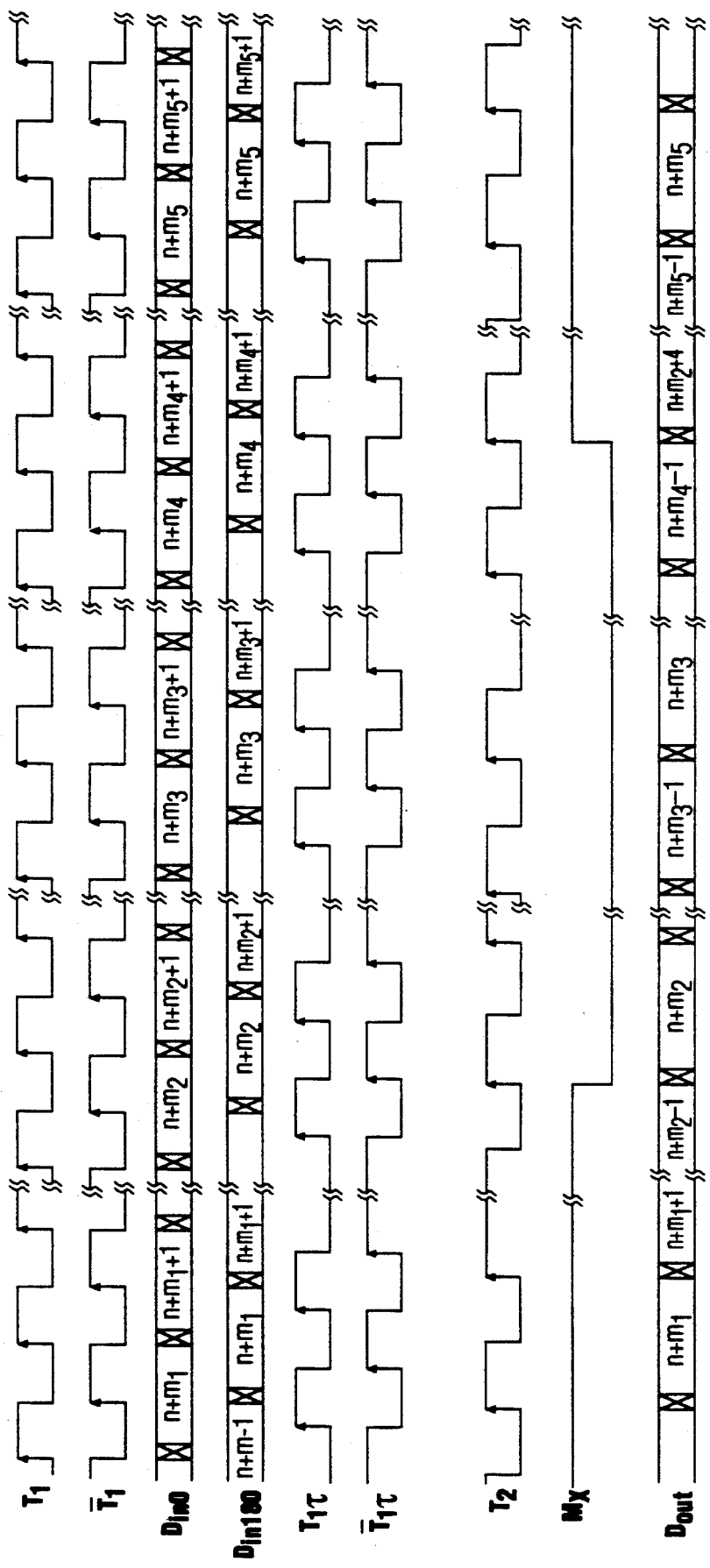
FIG. 2 shows some signal variations as a function of time in the circuit arrangement shown in FIG. 1.

The operation of the circuit shown in FIG. 1 will be described in detail hereinafter, notably the control circuit 3 and the multiplexer arrangements 2, with reference to FIG. 2 showing some signal variations occurring therein as a function of time.

All signals shown in FIG. 2 as a function of time are depicted with interruptions in time, marked by double slashes, in order to define given time intervals during which switching between the multiplexer inputs takes place.

The first clock signal which is denoted by the reference $T_1$ in FIG. 2 is applied to the successively connected registers 5, 6 and 7 in the circuit arrangement shown in FIG. 1. The inverted first clock signal shown in FIG. 2 and denoted by the reference $\overline{T}_1$ is applied to the first registers 9 of all multiplexer arrangements 2 in the arrangement shown in FIG. 1. The signal variation denoted by the reference $D_{in0}$ in FIG. 2 represents the data present at the first input 11 of the multiplexers 10 as delivered by the preceding register 5, 6 or 7. The data designated $D_{in180}$ in FIG. 2 represents the data which is applied to the respective second input 12 of the multiplexer 10 by the first registers 9 of the relevant multiplexer arrangement 2. In the signal variations of these two signals as shown in FIG. 2 time intervals denoted by a cross represent the periods of time during which the output data of the registers, wherefrom the data $D_{in0}$ and $D_{in180}$ originates, may change.

During these intervals, denoted by a cross, therefore, non-valid data is present at the inputs 11 and 12, which data is not to be switched to the output 13 of the relevant multiplexer 10 because it changes and cannot be correctly written into the subsequent second register 14.

In order to prevent such writing, the first clock signal $T_1$ and the inverted first clock signal $\overline{T}_1$ are delayed by a respective amount $\tau$. These delayed clock signals $T_{1\tau}$ and $\overline{T}_{1\tau}$ are also shown in FIG. 2. It will be apparent that the positive going edges of these delayed clock signals in FIG. 2 indicate the instants at which the respective associated data becomes valid, after a non-valid time interval marked by a cross, and at which the respective other data is still valid. Thus, in FIG. 2 the signal $T_{1\tau}$ comprises a first positive edge after the data $(n+m_1-1)$ of the signal $D_{in0}$ has become valid after an interval marked by a cross. At that instant the data $(n+m_1)$ present at the second input is still valid.

FIG. 2 also shows the signal variation of the second clock signal $T_2$. Via the phase comparators 34, 35 and the subsequent pulse generators 36 and 37 in the control circuit 3, a phase comparison is executed which indicates when the edges of either the signal $T_{1\tau}$ or the signal $\overline{T}_{1\tau}$ occur simultaneously or substantially simultaneously with the corresponding edges of the second clock signal $T_2$, or overlap. In the variations in time as shown in FIG. 2 this occurs for the first time for the signal $\overline{T}_{1\tau}$ and the signal $T_2$. Because the signal $\overline{T}_{1\tau}$ indicates when the input signals present at the second input 12 of the multiplexers 10 are valid, the signal $M_x$ which serves for the switching between the inputs of the multiplexers 10 is generated so that the multiplexers 10 are switched over to said second input at which valid data is then present. When subsequently the clock signals $T_1$ and $T_2$, and hence also the clock signals $T_{1\tau}$ and $\overline{T}_{1\tau}$, on the one hand, and $T_2$, on the other hand, are shifted only comparatively little with respect to one another, the multiplexers 10 remain switched to their second input.

In the time-compressed representation of FIG. 2 the reverse case occurs after some time, i.e. the signals $T_{1\tau}$ and $T_2$ reach the same or substantially the same phase position. In this case the multiplexers 10 are switched to their first inputs 11 by way of the signal $M_x$ which represents the output signal of the register 39 of FIG. 1. This can readily take place because the signal $T_{1\tau}$, indicating an instant at which the signals present at the first inputs 11 of the multiplexer 10 are valid and the data present at the second inputs 12 is still valid, coincides with the signal $T_2$ so that new valid data can be transferred to the second register 14 of the relevant multiplexer arrangement 2 by way of the corresponding edge of the signal $T_2$.

This operation is continued (not shown in FIG. 2), each time switching over taking place to the relevant associated multiplexer input 11 or 12 when the signal $T_{1\tau}$ or $\overline{T}_{1\tau}$ coincides with the signal $T_2$. Thus, even in the case of asynchronous clock signals $T_1$ and $T_2$ which can be floating with respect to one another, it is always ensured that new data can be written into the second registers 14 of the multiplexer arrangements 2 only at instants at which valid data is present at the inputs of the second registers 14 or at the outputs 13 of the multiplexers 10. These output signals of the second registers 14 are denoted by the signal waveform $D_{out}$ in FIG. 1. This data is subsequently multiplied and added and represents the output signal of the circuit arrangement.

I claim:

1. A circuit arrangement for conversion of a digital data signal ($D_{in}$) having a first clock frequency ($T_1$) into a signal having a second clock frequency ($T_2$), comprising an interpolator/decimator which includes a series of successively connected input registers for the data signal, each register comprising a clock input for a register clock signal, a data input for the data signal, and a data output which is coupled to an input of arithmetic circuits for calculating a linear combination of output signals, characterized in that at least one multiplexer is provided between an input register and the arithmetic circuits, a first input of the multiplexer being coupled to a data output of an input register, a second input of the multiplexer being coupled, via a first register, to said data output and an output of the multiplexer being coupled to an input of a second register, said first register comprising a clock input which is coupled to the output of an inverter present for applying an inverted first clock signal to said first register, said second register comprising a clock input for a clock signal of the second clock frequency ($T_2$), said circuit arrangement furthermore comprising a control circuit, an output of which is coupled to a control input of the multiplexer in order to apply a control signal ($M_x$) thereto so that the output of the multiplexer is connected to that one input of the first and second inputs of the multiplexer that receives a stable signal during writing of data into the second register.

2. A circuit arrangement as claimed in claim 1, characterized in that in the interpolator/decimator a multiplexer is provided between each of the input registers and an associated input of the arithmetic circuits, the multiplexers being connected to the same control circuit and the clock inputs of the input registers being connected to a clock generator for the first clock frequency ($T_1$).

3. A circuit arrangement as claimed in claim 1, characterized in that the control circuit comprises a first and a second delay member for delaying the first clock signal and the inverted first clock signal, respectively, by such an amount of time that edges of the delayed first clock signal indicate instants at which new data appearing at the first input of the multiplexer is already valid and data present at the second input is still valid, and that edges of the delayed inverted first clock signal indicate instants at which new data appearing at the second input is already valid and data present at the first input is still valid.

4. A circuit arrangement as claimed in claim 3, characterized in that the control circuit comprises a first phase comparator for performing a phase comparison between the clock signal supplied by the first delay member and the second clock signal ($T_2$), as well as a second phase comparator for performing a phase comparison between the signal supplied by the second delay member and the second clock signal ($T_2$), outputs of the two phase comparators being coupled to inputs of a first and a second pulse generator, outputs of the two pulse generators being coupled to control inputs of the multiplexer for switching over the multiplexer.

5. A circuit arrangement as claimed in claim 4, characterized in that the control circuit is arranged for switching between the first and second multiplexer inputs of the multiplexer, in dependence on the output signals of the two pulse generators in such a manner that the first multiplexer input is coupled to the output of the multiplexer when the first phase comparator supplies an output signal which indicates that corresponding edges of the delayed first clock signal and the second clock signal overlap, that the second multiplexer input is coupled to the output of the multiplexer when the second phase comparator supplies an output signal which indicates that corresponding edges of the delayed inverted first clock signal and the second clock signal overlap.

6. A circuit arrangement as claimed in claim 1, characterized in that the circuit arrangement is included in an apparatus for processing a digital video signal, notably a digital television signal.

7. A circuit arrangement as claimed in claim 6, characterized in that the circuit arrangement for conversion of a digital signal of a first clock frequency into a signal of a second clock frequency is coupled to an output of an image signal processing circuit, the circuit arrangement being provided for processing a digital image signal at a system frequency not associated with the image signal, said image signal processing circuit comprising a correction memory and an interpolator with a decimator which serves to convert the digital image signal to a synchronizing signal raster imposed by a system clock, the circuit arrangement for conversion of the digital signal being connected for converting the image signal supplied by the image signal processing circuit at the system clock frequency to a different frequency.

8. A circuit arrangement as claimed in claim 1 for use in an image display apparatus, notably a television apparatus, comprising an input for a digital input signal of a first clock frequency wherein the circuit arrangement converts the digital input signal of the first clock frequency into a digital signal of a second clock frequency, the image display apparatus comprising means for generating images on a display screen on the basis of a digital signal of the second clock frequency.

* * * * *